United States Patent [19]

Majima

[11] 4,408,875
[45] Oct. 11, 1983

[54] METHOD OF PROJECTING CIRCUIT PATTERNS

[75] Inventor: Teiji Majima, Komae, Japan

[73] Assignee: Fujitsu Limited, Kawasaki, Japan

[21] Appl. No.: 333,814

[22] Filed: Dec. 31, 1981

[30] Foreign Application Priority Data

Dec. 29, 1980 [JP] Japan .................. 55-187235
Apr. 10, 1981 [JP] Japan .................. 56-53831

[51] Int. Cl.³ .......................................... G03B 27/42
[52] U.S. Cl. .......................................... 355/53; 355/77
[58] Field of Search ............... 355/53, 77, 54, 86; 427/99

[56] References Cited

U.S. PATENT DOCUMENTS 3,510,349 5/1970 Jones ............................ 427/99
3,716,296 2/1973 Springer et al. ............... 355/53
4,335,161 6/1982 Luo .............................. 427/99

FOREIGN PATENT DOCUMENTS 17759 10/1980 European Pat. Off. ........... 355/53
2727190 12/1977 Fed. Rep. of Germany ....... 355/53
1259537 1/1972 United Kingdom ............... 355/53

Primary Examiner—Monroe H. Hayes
Attorney, Agent, or Firm—Staas & Halsey

[57] ABSTRACT

A method of exposure used to form circuit patterns of a circuit chip of, for example, a magnetic bubble memory device or a semiconductor IC device whose circuit patterns are composed of a plurality of partially different circuit patterns. In this method, a plurality of projections of a single reticle is effected on a substrate as the substrate is moved by predetermined pitch lengths, and it is possible to form circuit patterns which are different from mere combination of the circuit patterns of the reticle.

10 Claims, 28 Drawing Figures

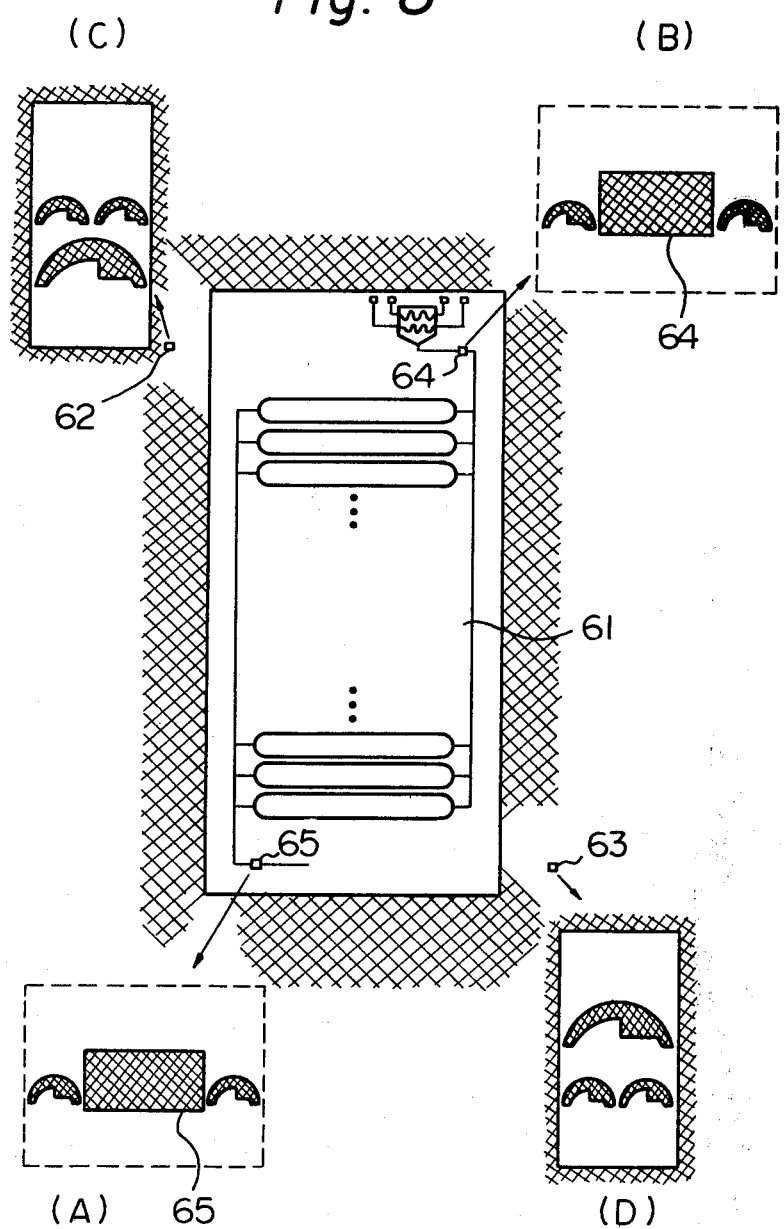

METHOD OF PROJECTING CIRCUIT PATTERNS

BACKGROUND OF THE INVENTION

(1) Field of the Invention

The present invention relates to a method of projecting circuit patterns, more particularly to a method of exposure which is used for printing circuit patterns on a chip of, for example, a magnetic bubble memory device, when a circuit pattern of the chip is composed of a plurality of circuit pattern portions each being partially different from each other.

The present invention can be adapted not only to a usual exposing apparatus using ultraviolet light but also to an exposing apparatus using, for example, X-rays or electron beams which can repeatedly print a plurality of photoresist patterns on a substrate by changing the relative position of the substrate and light source.

The substrate on which the resist patterns are printed according to the present invention can be a substrate of a magnetic bubble memory chip, a substrate of a semiconductor IC chip, or a substrate of thin film magnetic heads. The method according to the present invention is also useful in making an exposing mask which is used for printing mask patterns on these substrates by using a repeater machine.

(2) Description of the Prior Art

At present, photolithographic technology is used to form microelectronic circuits, used in a device such as a magnetic bubble memory device or a semiconductor IC device, on a wafer of crystalline material.

That is, a pattern forming layer of, for example, metal is formed on the surface of the wafer, made of single crystalline silicone in the case of the semiconductor IC chip and made of single crystalline magnetic garnet in the case of the magnetic bubble chip. The pattern forming layer is coated with a photosensitive coating known as photoresist, or resist. A projector type exposing apparatus is then used to project a plurality of mask patterns in a reduced size on the photoresist coating, while moving the wafer at a constant pitch length. One then dissolves and washes away the exposed portions of the photosensitive resist when a positive-acting resist is used or the unexposed portions of the photosensitive resist when a negative-acting resist is used, thereby leaving a photoresist mask on the pattern forming layer. After the photoresist process, a chemical etching process or a dry etching process is used to form microelectronic circuit patterns from the pattern forming layer on the wafer, and the wafer is cut into chips of unit circuits.

In recent years, the memory capacities of semiconductor memory devices and the integration degree of IC devices have increased considerably. The circuit patterns have consequently become very fine and the size of the chips have increased. Unit circuits constituting single devices are therefore formed by a plurality of exposures.

For example, the memory capacities of magnetic bubble memory devices, i.e., the number of magnetic bubbles stored in magnetic bubble chips, have steadily increased and the diameters of each magnetic bubble representing information have been significantly reduced. Each of the conducting patterns made, e.g., of Au or Al-Cu alloy and each of transfer patterns made of permalloy therefore has become very small.

In a magnetic bubble memory device whose memory capacity is 1 Mbits and which uses bubbles each having a diameter of, for example, 2 $\mu$m, the minimum size of each of the circuit patterns is approximately 1 $\mu$m. Since a conventional contact-type exposing apparatus which uses an exposing mask having the same size as the circuit pattern cannot form such fine circuit patterns accurately, a projection-type exposing apparatus which projects circuit patterns on a reduced scale of, for example, 1/10 has been used.

Said 1 Mbit magnetic bubble memory chip being approximately 10 mm square, even the highest-precision type of projection-type exposuring apparatus available cannot easily project circuit patterns of 1 $\mu$m over the entire 10 mm square area with high precision. Therefore, circuit patterns of such a 1 Mbit magnetic bubble memory device are formed by projecting a 500 Kbit circuit pattern two times side by side using the central portion of the projectable area of the exposing apparatus, which has relatively high resolution, rather than the four corner portions, which have relatively low resolution.

The above-mentioned conventional exposing method results in a unit circuit composed of a plurality of half patterns, each of which is partially different from each other but each of which comprises all the different portions of all the half patterns. After a chip of the unit circuit is completed, bonding wires or the like are used to selectively connect the necessary one portion of each half pattern to a signal path, such as input or output terminals. If it is necessary to interconnect conducting pattern portions of half patterns, bonding wires are used to connect the conducting pattern portions to the printed conducting patterns formed on a ceramic base, after mounting the chip of the unit circuit on the ceramic base.

However, the above-mentioned conventional method results in each of the half patterns necessarily including unnecessary pattern portions, i.e., the portions meant for other half patterns. This prevents the effective use of the area of a chip and limits the integration degree of the device. The need in the conventional method for a wire-bonding process to select the necessary one portion of the half patterns and to interconnect conducting pattern portions of the half patterns complicates the manufacturing process of the device, increases the percentage of the faulty products, and lowers the reliability of the manufactured device. The conventional method moreover does not allow interconnection of propagation patterns such as the transfer patterns of magnetic bubble memory devices which are surrounded by guardrails.

SUMMARY OF THE INVENTION

It is, therefore, the principal object of the present invention to make it possible to form a unit circuit composed of a plurality of circuit patterns, each of which is partially different from each other, by using a single pattern mask and by changing the transfer pitches of a wafer.

It is another object of the present invention to increase the efficiency of utilization of a chip area on which a unit circuit composed of a plurality of partially different patterns is formed.

It is still another object of the present invention to increase the reliability and the yield of the electronic device comprising a unit circuit composed of a plurality of partially different circuit patterns.

It is still another object of the present invention to make it possible to connect or disconnect propagation patterns of circuit patterns of a unit circuit which is composed of a plurality of partially different circuit patterns by changing the transfer pitches of a wafer, thereby making it possible to use a single mask pattern to form a unit circuit having a larger area than the projectable area of an exposing apparatus.

According to the present invention there is provided a method of projecting circuit patterns which uses a photosensitive layer formed on a substrate and an exposing mask which has mask patterns formed within a transparent area thereof, said exposing mask and said substrate being relatively moved by predetermined pitch lengths while said mask patterns are printed on said photosensitive layer at every relative position, said printed mask patterns forming on said photosensitive layer a plurality of element patterns each of which comprises at least two adjacent circuit patterns, said method characterized in that said exposing mask comprises a first transparent area and second transparent area which are disposed to the two sides of said first transparent area along the direction of movement of said substrate; said pitch length comprises pitch length A between adjacent printed mask patterns within said element pattern and pitch length B between adjacent printed mask patterns of the adjacent element patterns, said pitch length A and said pitch length B being kept at constant values and said pitch length B being greater than said pitch length A; and mask patterns of said second transparent areas are printed on portions of areas of said photosensitive layer which correspond to said first transparent areas printed one pitch length before and after the projection of said mask patterns of said second transparent area, thereby forming said element pattern including different portions from said mask patterns of said exposing mask.

BRIEF DESCRIPTION OF THE DRAWINGS

FIGS. 5 through 8 are schematic views used for explaining embodiments according to the present invention;

DESCRIPTION OF THE PREFERRED EMBODIMENTS

Embodiments of the present invention for the case of a magnetic bubble memory device will now be described in comparison with a prior art method with reference to the attached drawings.

Figure 1:
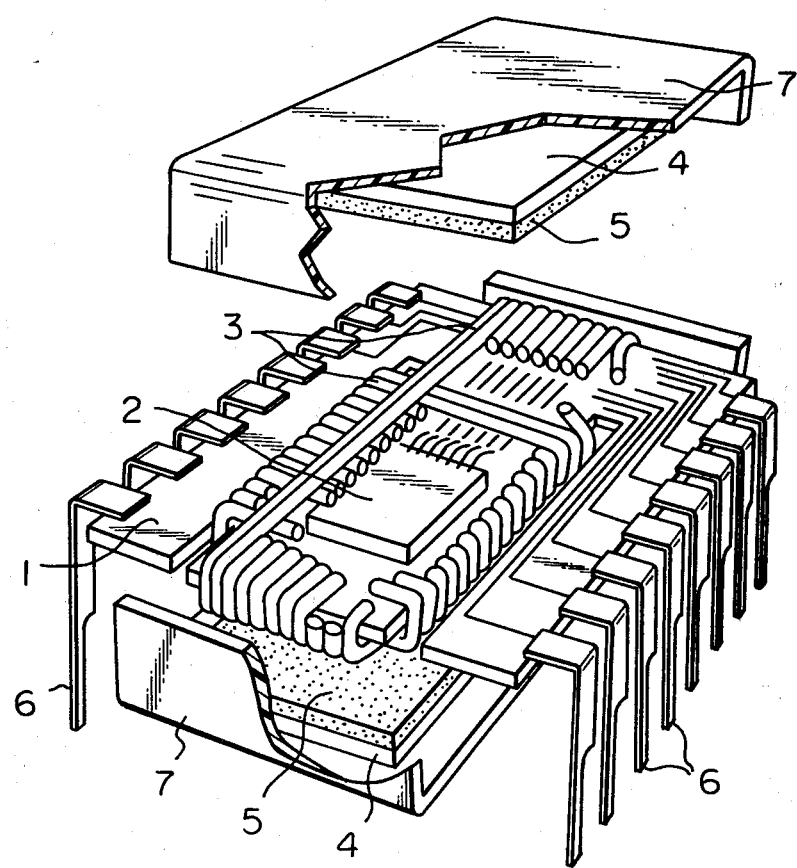
FIG. 1 is a perspective view illustrating a schematic structure of a general magnetic bubble memory device.

As illustrated in FIG. 1, a general magnetic bubble memory device comprises a memory chip 2 mounted on an insulating base 1, a XY coil 3, thin plate magnets 4, ferrite yokes 5, pin terminals 6, and a shield case 7. The XY coil 3 applies a rotating magnetic field to the memory chip and effects, for example, transfer of magnetic bubbles. The thin plate magnets 4 and the ferrite yokes 5 apply a bias magnetic field to the memory chip 2 in order to stably retain the magnetic bubbles in the memory chip. The memory chip 2 comprises a layer of magnetic material formed on a substrate of, for example, GGG (gadlium galium garnet), conductor patterns (Au, Al-Cu alloy, and so on) formed on the layer of magnetic material, and transfer patterns (permalloy and so on) formed on the conductor patterns.

Figure 2:
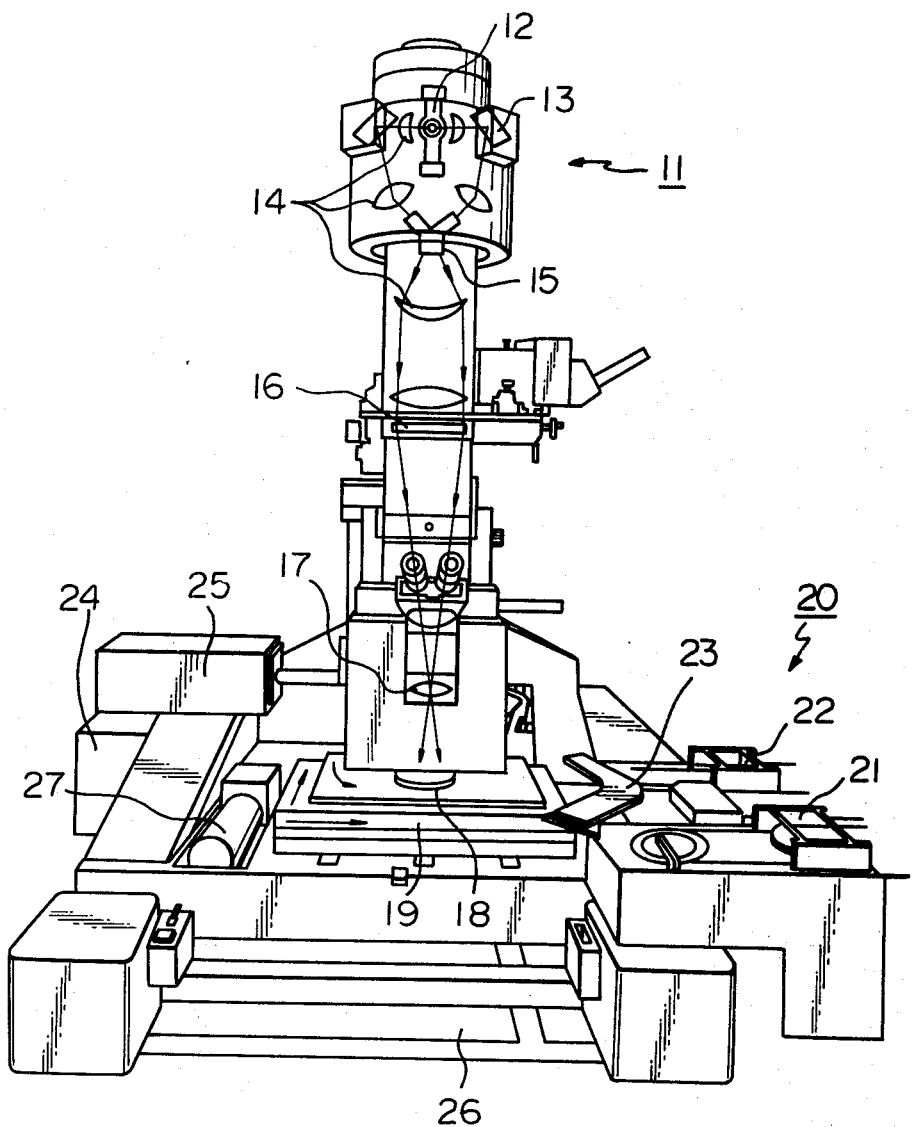
FIG. 2 is a perspective view illustrating a schematic structure of an exposing apparatus used in an exposing method according to the present invention.

FIG. 2 illustrates a projection-type exposing apparatus used for forming the conductor patterns and the transfer patterns of the magnetic bubble memory chip 2. In FIG. 2, reference numeral 11 designates a light source comprising a mercury lamp 12, reflection mirrors 13, condenser lenses 14, and an optical fiber 15. Reference numeral 16 designates a pattern mask, i.e., a reticle having mask patterns which are 10 times as large as patterns of practical circuit patterns. Reference numeral 17 is a reducing lens used for projecting the mask patterns, and reference numeral 18 is a wafer mounted on an X-Y stage 19. Reference numeral 20 is an automatic wafer supply mechanism comprising a wafer sender 21, a wafer receiver 22, and a boomerang-shaped member 23 which transfers a wafer 18. Reference numeral 24 designates a laser range finder, reference numeral 25 designates a TV camera used for aligning the wafer 18, reference numeral 26 designates a vibration-free base, and reference numeral 27 designates a drive apparatus.

In the exposing apparatus of FIG. 2, the mask patterns of the reticle 16 are projected on the wafer 18 in a scale of 1/10 by light from the light source 11, allowing the precision formation of very fine circuit patterns on the wafer 18. The drive apparatus 27 moves the X-Y stage 19 and, therefore, the wafer 18 by predetermined pitch lengths, thereby allowing a single reticle to effect sequential printing of circuit patterns on the wafer 18. According to the present invention, the pitch lengths at which the wafer 18 is moved are changed, enabling the use of a single reticle to form a unit circuit composed of a plurality of partially different patterns.

A method of projecting circuit patterns of a magnetic bubble memory chip by using the above-mentioned exposing apparatus will now be explained. A general magnetic bubble memory device which uses a block brigade transfer system comprises two memory areas in order to decrease access time. In such a memory device, bubble signals corresponding to input data are divided into an even series and an odd series and are memorized in the two memory areas, respectively. Such a memory system is called an odd-even system.

Figure 3:
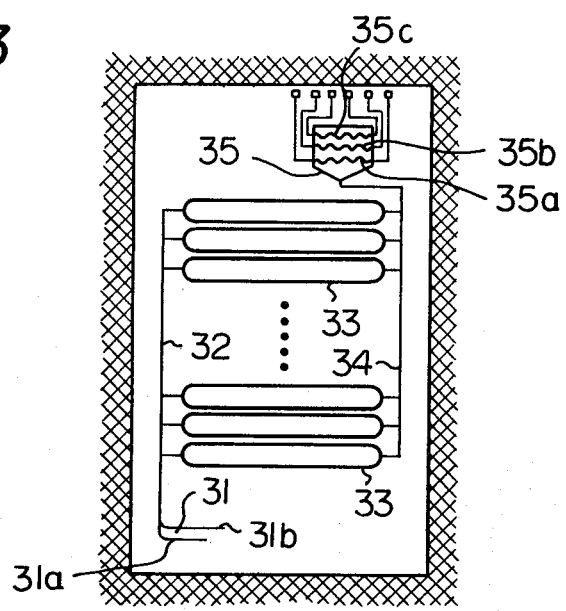
FIG. 3 is a schematic view illustrating a mask pattern used in a conventional method for forming a magnetic bubble memory chip.

FIG. 3 illustrates a conventional exposing mask used for forming permalloy patterns, i.e., transfer patterns of such a magnetic bubble memory device. The exposing mask comprises mask patterns used for forming a write-in major line 32 having end portions 31a and 31b which are coupled to bubble generators, minor loops 33, a readout major line 34, and a bubble detector 35. These mask patterns are in practice constituted, for example, by T-I patterns and/or half-disc patterns disposed in lines.

It should be noted that, in the mask patterns of the above-mentioned exposing mask, the write-in major line 32 comprises two end portions 31a and 31b which are coupled to the bubble generators, and the detector 35 including a dummy element comprises three detector elements 35a, 35b, and 35c which are made of permalloy and each of which has a fishbone-shape or a serpentine-shape.

Figure 4:
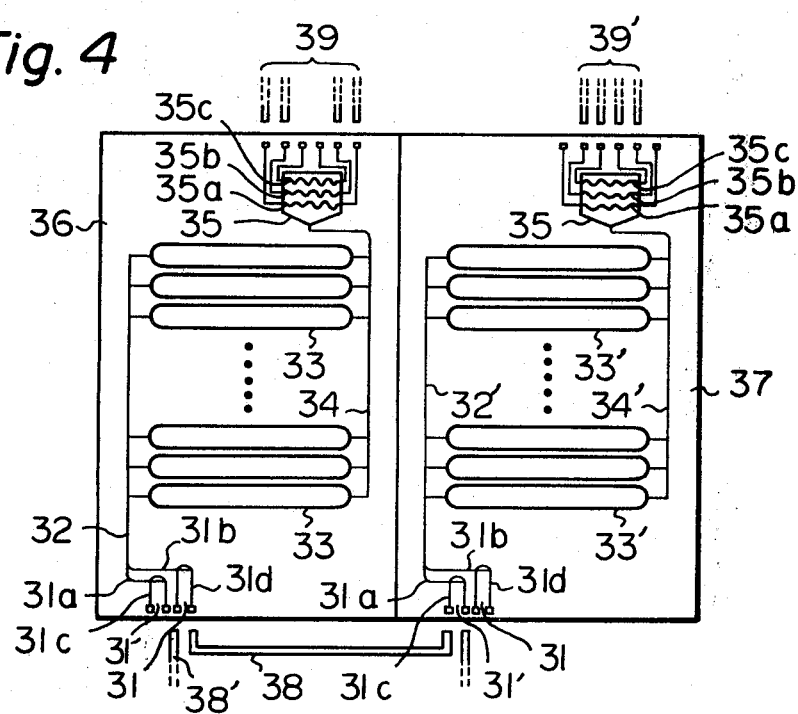
FIG. 4 is a schematic view illustrating a circuit pattern of a conventional magnetic bubble memory device formed by using the mask pattern of FIG. 3.

FIG. 4 illustrates a 1 Mbit bubble memory chip having the circuit structure of the odd-even system, which is composed of two 500 Kbit memory patterns formed by projecting the above-mentioned mask patterns two times at a pitch length of 5 mm.

In the manufacturing process of this memory chip, a wafer on which is formed a layer of single crystalline magnetic garnet is coated with an insulating film. A photoetching process is used, on the insulating film, to form conductor patterns controlling magnetic bubbles, for example, conductor patterns 31c and 31d of FIG. 4, which form bubble generators. The conductor patterns are then coated with an insulating layer and the photoetching mask of FIG. 3 is used to form permalloy patterns on the insulating layer.

In FIG. 4, 31 and 31' are two bubble generators each being composed of conductor patterns 31c and 31d and the end portions 31a and 31b of the write-in major line 32 which are formed on the conducting patterns 31c and 31d respectively. In this case, the write-in major line 32 is composed, for example, of halfdisc-shaped permalloy patterns. The circuit patterns 36 on the left side of FIG. 4 constitute an even block which memorizes even series of bubble signals, and the circuit patterns 37 on the right side of FIG. 4 constitute an odd block which memorizes odd series of bubble signals. One memory chip is composed of these two blocks 36 and 37.

In the memory device of FIG. 4, which uses a major-minor system, a large number of minor loops 33 and 33' are disposed and coupled to transfer patterns, i.e., major lines 32 and 32', respectively, at every two bits. When write-in of bubble signals is effected, the bubble signals are transmitted through the major lines 32 and 32' by driving a magnetic field applied from the XY coil. When magnetic bubbles of even orders of the bubble signals are transmitted to each bit position of the major line 32 corresponding to the positions of the minor loops 33 in the even block 36, magnetic bubbles of odd orders are transmitted to each bit position of the major line 32' corresponding to the positions of the minor loops 33' in the odd block 37.

In this condition, the bubbles on the major lines 32 and 32' are transferred to the corresponding minor loops 33 and 33' by the action of transfer gates, which are composed of conducting patterns and which are not shown in the drawing, thereby effecting write-in of information to the minor loops 33 and 33'.

The bubble generators 31 and 31' of the even and odd blocks are operated by a common current source in order to simplify the drive circuit (not shown in the drawing). Therefore, it is necessary that the numbers of bits of the transfer patterns from the bubble generator 31 or 31' to the write-in major line 32 in the even block 36 and the numbers of bits from the bubble generator 31 or 31' to the write-in major line 32' in the odd block 37 differ from each other by one. This difference is obtained by selectively using one of the two bubble generators 31 and 31' in each block.

That is, as illustrated in FIG. 4, the bubble generator 31 on the right side is used in the even block 36, and the bubble generator 31' on the left side is used in the odd block 37. The selected generator 31 in the even block 36 and the selected generator 31' in the odd block 37 are connected to external electrode terminals 38 and 38' which are connected to the drive circuit. In this case, the number of bits from the bubble generators 31 and 31' to the major lines 32 or 32' differ from each other by one.

It is also necessary to change the numbers of bits from the readout major lines 34 and 34' to the bubble detectors 35 from each other. This difference is obtained by selectively using two of the three bubble detector elements 35a, 35b, and 35c of the bubble detector 35 which are disposed in positions different from each other by one bit.

As illustrated in FIG. 4, in the even block 36, bubble signals from the readout major line 34 are detected by the detector element 35a disposed in the inside of the block 36. In the odd block 37, bubble signals from the readout major line 34' are detected by the detector element 35b disposed in the middle of the detector elements. A one bit difference is thereby achieved.

The detector element 35b of the even block 36 and the detector element 35c of the odd block 37 are used as dummy detector elements in order to use a differential amplifier which has a high detecting efficiency to detect the bubble signals. Signals from these dummy detector elements 35b and 35c are supplied to one of the input terminals of the differential amplifier. Signals from the detector element 35a of the even block 36 and the detector element 35b of the odd block 37 are combined through external electrode terminals 39 and 39' and supplied to the other input terminals of the differential amplifier.

In the above-mentioned bubble memory chip formed by the conventional pattern projecting method, since the bubble detector in the even block and the bubble detector in the odd block use detector elements disposed in different positions, the detecting characteristics of the even block and the odd block differ from each other. The above-mentioned bubble memory chip comprises unnecessary bubble generators and bubble detectors not used in practice, therefore restricting the pattern density. Moreover, it is necessary to use wire-bonding to connect many points between the bubble generators and the external electrode terminals and between the bubble detectors and the external electrode terminals, whereby there is a possibility of misconnection.

Some embodiments of the present invention will now be explained with reference to FIGS. 5 through 8.

Figure 5:
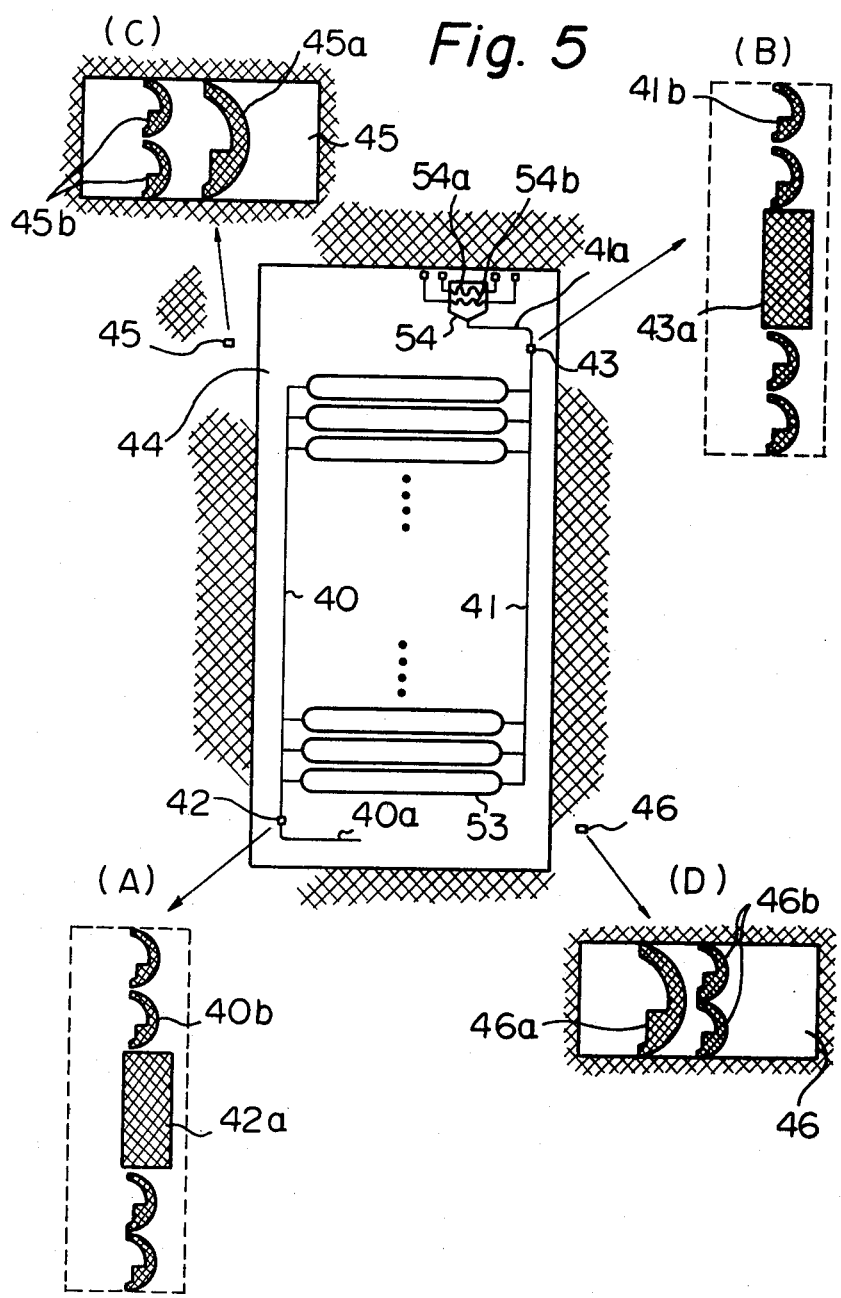

FIG. 5 illustrates an exposing mask used in a method according to the present invention. The exposing mask of FIG. 5 comprises opaque mask patterns formed in a transparent area, the mask patterns comprising patterns for forming a write-in major line 40 having a single end portion 40a which constitutes a bubble generator, a readout major line 41, minor loops 53, and a bubble detector 54 having two detector elements 54a and 54b. The major lines 40 and 41 in a main pattern area 44 in which are disposed the mask patterns 40, 53, and 54 comprise changeable pattern areas 42 and 43. On the lower and upper positions of both outsides of the main pattern area 44 are formed subpattern areas 45 and 46. The positive-acting resist film is exposed to light through the main and subpattern areas 44, 45, and 46. After resist patterns are obtained by developing the resist film, the parts of the permalloy layer which are not covered by the resist patterns are etched away, thereby forming permalloy pattern circuits corresponding the resist patterns.

The four partial drawings (A), (B), (C), and (D) at the four corners of FIG. 5 are enlarged views illustrating the changeable pattern areas 42 and 43 and the subpattern areas 45 and 46.

In the subpattern areas 45 and 46 shown in the drawings (C) and (D), opaque mask patterns which correspond to halfdisc-shaped transfer patterns of permalloy and which are disposed in a transparent area are formed. The opaque mask patterns comprise unit pattern 45a or 46a, for forming one permalloy pattern corresponding to one bit, and unit patterns 45b or 46b, for forming two permalloy patterns corresponding to two bits and each of which having a half size of the permalloy pattern 45a or 46a. The unit pattern 45a or 46a and the unit pattern 45b or 46b are disposed parallel to each other. The changeable pattern areas 42 and 43 of the drawings (A) and (B) comprise opaque patterns 40b and 41b which correspond to halfdisc-type transfer patterns of major lines 40 and 41, respectively, and which are formed in transparent areas. The changeable pattern areas 42 and 43 also comprise rectangular-shaped opaque portions 42a and 43a, respectively, which have lengths corresponding to two permalloy patterns, i.e., two bits along the major line 40 or 41, and each of which is disposed between two halfdisc patterns.

When the exposure by using the exposing mask of FIG. 5 is effected while moving the wafer at a predetermined constant distance in a transverse direction of FIG. 5, the distance of movement of the wafer is changed slightly (i.e., several microns through several hundreds microns) from the predetermined constant distance at every two movement operations, thereby selectively projecting one or two unit patterns 45a or 45b and 46a or 46b of the subpattern areas 45 and 46 to the changeable pattern areas 43 and 42, respectively.

Therefore, in the above-mentioned embodiment, it is possible to selectively and continuously insert the transfer patterns having different bits into the major lines 40 and 41. The process of inserting such transfer patterns will now be explained in detail with reference to FIG. 6.

Figure 6:
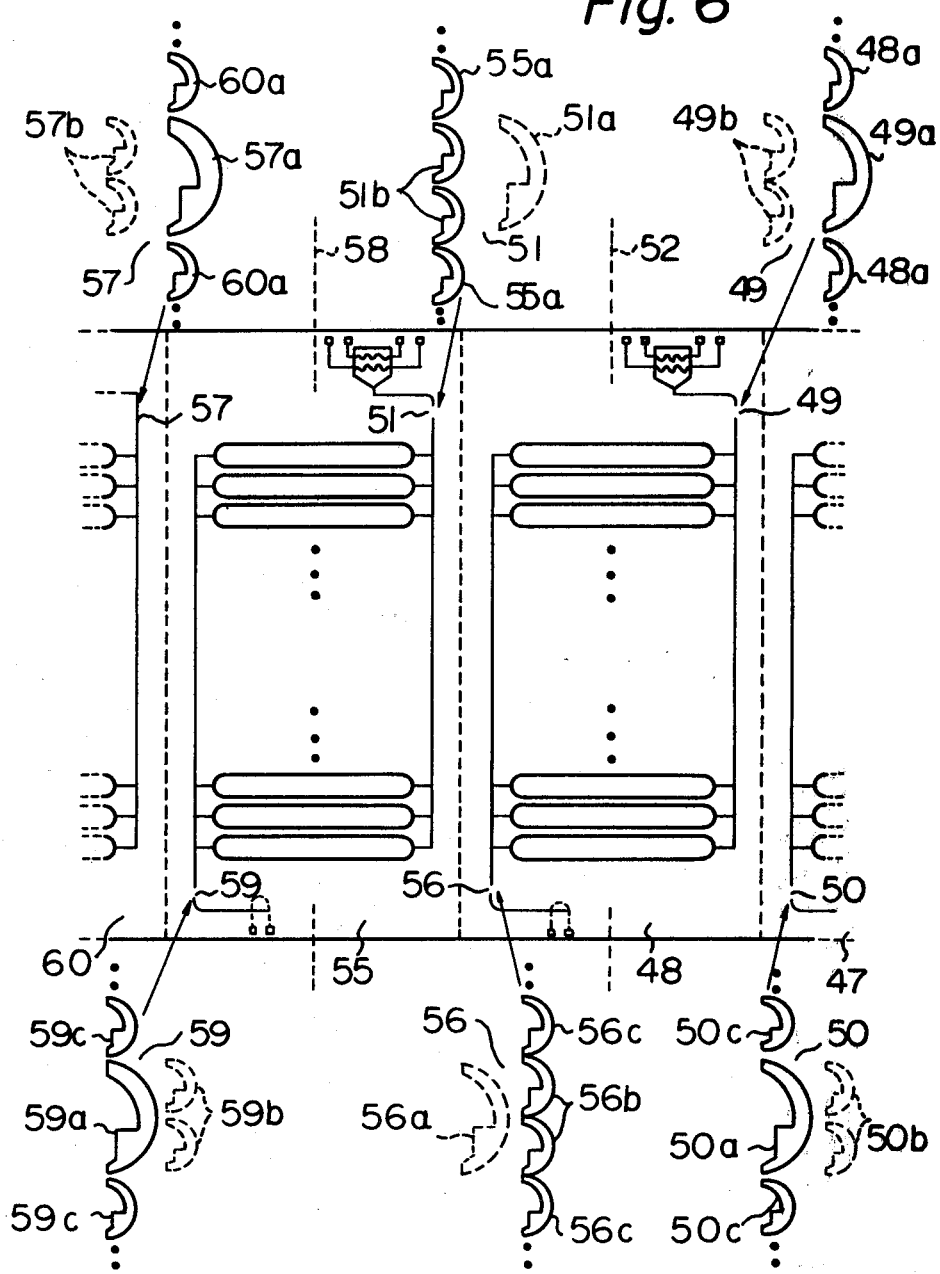

FIG. 6 illustrates the process of continuously forming permalloy pattern circuits which have different numbers of bits in the transfer patterns at every two pitch lengths by exposing the photoresist film on the wafer through the exposing mask of FIG. 5.

The first projection through the exposing mask of FIG. 5 is effected on the right end portion of the wafer, whereby the mask patterns 40, 41, 53, and 54 in the main pattern area 44 and the unit patterns 45a, 45b, 46a, and 46b in the subpattern areas 45 and 46 are printed on the photoresist film.

The first projection forms resist patterns 47 corresponding to the mask patterns in the main pattern area 44 and resist patterns 49 corresponding to the subpatterns 45 and comprising unit resist patterns 49a and 49b corresponding to the unit patterns of the subpatterns 45. In this case, this also forms unit resist patterns corresponding to the unit patterns of the subpatterns 46, but the illustration thereof is omitted in the drawing.

The wafer is then transferred to the right side by a pitch length slightly less than the area length of the main pattern area 44. The exposing mask of FIG. 5 is then used to effect the second projection on the wafer in a similar manner to the first projection, thereby projecting the mask patterns 40, 41, 53, and 54 and the unit patterns 45a, 45b, 46a, 46b on the photoresist film. If the horizontal length and the longitudinal length of the main pattern 44 projected on the wafer are 5 mm and 10 mm, respectively, the horizontal length, i.e., the length along the direction of movement of the wafer becomes the area length of the main pattern area, which is 5 mm. Therefore, before the second projection, the wafer is moved to the right side by a distance of 4.99 mm, slightly less than the area length. The second projection forms resist patterns 48 corresponding to the mask patterns of the main pattern area 44, resist patterns 50 consisting of unit resist patterns 50a and 50b corresponding to the unit patterns in the subpattern area 46, and resist patterns 51 consisting of unit resist patterns 51a and 51b corresponding to the unit patterns in the subpattern area 45.

Since the transfer pitch length of the wafer before the second projection is effected is less than the area length of the main pattern by 10 μm, the resist patterns 47 and 48 are projected in a manner that the patterns projected by the main pattern area 44 at the first and the second projections overlap each other. Therefore, the unit resist patterns 50a and 50b are projected in a manner that the unit resist pattern 50a is projected on an unexposed area corresponding to the rectangular-shaped area 42a of the changeable pattern area 42 of the exposing mask, thereby the unit resist pattern 50a of one bit is formed continuously between resist patterns 50c which are formed by the mask patterns 40b of the major line 40 by the first projection. In this case, the area 49 corresponding to the changeable pattern area 43 of the exposing mask has disposed unit resist patterns 49a and 49b which are previously formed by the first projection, so that resist patterns 48a of the major line corresponding to the mask patterns 41b are formed by the second projection in a manner that the resist patterns 48a and the unit resist pattern 49a of one bit are continuously formed. The unit resist pattern 49b of two bits, which are shown by dotted lines in FIG. 6 and which are projected by the first projection, are exposed to light when the resist patterns 48 are projected by the second projection, so that the unit resist patterns 49b are not formed. The unit resist patterns 50b of two bits, shown by dotted lines in FIG. 6, are also not formed since they are projected on the portion of the photoresist film already exposed to light by the first projection.

The exposing mask of FIG. 5 is used to effect the third projection after the wafer is moved 5 mm from the center line 52 of the resist pattern 48 formed by the second projection. The projection form resist pattern 55 corresponding to the mask pattern in the main pattern area 44, resist patterns 56 composed of unit resist patterns 56a and 56b corresponding to the unit patterns of the subpattern area 46, and resist patterns 57 composed of unit resist patterns 57a and 57b corresponding to the unit patterns of the subpattern area 45. Since the movement pitch length of the wafer before the third projection is equal to the area length of the main pattern area 44 and is not equal to the movement pitch length before the second projection, the unit resist patterns 56a and 56b are projected on an unexposed area which corresponds to the rectangular area 42a of the variable pattern area 42 and which is formed by the second projection, in a manner that the unit resist patterns 56b of two bits are formed continuously between resist patterns 56c of the write-in major line, which are already formed by the second projection. In this case, resist patterns 55a of the readout major line corresponding to the mask pattern 41 are projected in a manner that the resist patterns 55a and the unit resist patterns 51b of two bits which are already formed on an area 51 by the second projection are continuously formed. Since the portion of the unit resist pattern 51a of one bit, shown by dotted lines, is exposed to light through the transparent area of the exposing mask by the third projection, the unit resist pattern 51a is not formed. The unit resist pattern 56a of one bit is also not formed since the unit resist pattern 56a is projected on the portion of the photoresist film already exposed to light by the second projection.

The fourth projection is effected after the wafer is moved from the center line 58 of the resist pattern 55 by 4.99 mm, the same pitch length as that of the movement effected before the second projection. The fourth projection forms on the photoresist film resist pattern 60 corresponding to the main pattern area 44, unit resist patterns 59a and 59b corresponding to the subpattern area 46, and unit resist patterns (not shown in the drawing) which correspond to the subpattern area 45 and which are the same as the resist patterns 51.

In this case, the unit resist patterns 59a and 59b are projected on an unexposed area 59 of the resist pattern 55, in a manner that the unit resist pattern 59a of one bit is continuously formed between resist patterns 59c of the write-in major line which are already projected by the third projection. Resist patterns 60a of the readout major line are projected on the photoresist film so that the unit resist pattern 57a of one bit which is already projected on an area 57 is located continuously between the resist pattern 60a. In this case, the unit resist patterns 57b and 59b shown by dotted lines are erased in a similar manner to the case of the unit resist patterns 49b and 50b mentioned above.

In the above-mentioned exposing method, each projection is effected as the movement pitch length of the wafer is alternated between the area length of the main pattern and a length slightly less than the area length, whereby the unit resist patterns of one or two bits of the subpattern area are alternatively and selectively disposed on the changeable pattern area of the main pattern area. After these projections are effected, the phtoresist film is developed and the resist patterns are formed on the permalloy layer. The permalloy layer is then etched and the permalloy pattern circuits corresponding to the resist patterns are obtained.

One magnetic bubble memory chip is composed of permalloy patterns corresponding to the resist patterns 48 and 55 of FIG. 6. Concerning these two resist patterns 48 and 55, both the numbers of transfer bits from the bubble generators to the write-in major lines and the numbers of transfer bits from the readout major lines to the bubble detectors differ from each other by one. Therefore a magnetic bubble memory chip having the odd-even system which uses a block brigade transfer control system is obtained.

As illustrated in FIG. 6, the unnecessary unit resist patterns 49b, 50b, 51a, 56a, 57b, and 59b disposed on the sides of the readout major line and the write-in major line are erased by exposure to light through the transparent portions of the main pattern area of the exposing mask. However, it should be noted that even if these unnecessary unit resist patterns are formed, the transferring function of the magnetic bubbles is not effected.

Figure 7:
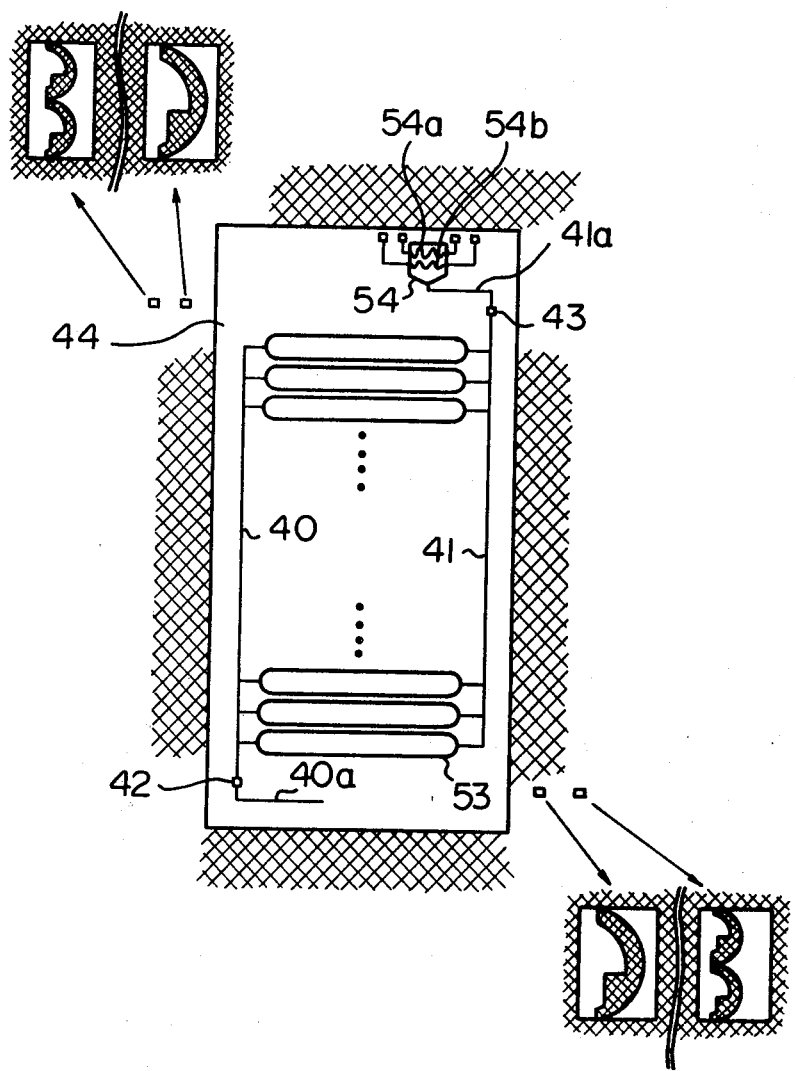

In the above-mentioned embodiment, the difference between the alternating movement pitch lengths is 10 $\mu$m. However, it should be noted that this difference may be several hundred microns. It is also possible that this difference be larger than 1 mm. In this case, each of the subpattern areas 45 and 46 of FIG. 5 can be divided into two blocks as illustrated in FIG. 7.

In the above-mentioned embodiment of FIG. 5, the transfer bit numbers from the bubble generator to the write-in major line and the transfer bit numbers from the readout major line to the bubble detector are changed at the transfer patterns of the longitudinal direction. FIG. 8 illustrates an exposing mask used in another embodiment in which the change of the transfer bit numbers is effected at the transfer patterns of the transverse direction.

The exposing mask of FIG. 8 comprises changeable pattern areas 64 and 65 which are disposed within a main pattern area 61 and on the transverse portions of the transfer patterns, i.e., on the portions of a write-in major line which is close to a bubble generator and a readout major line which is close to a bubble detector. Each subpattern area 62 and 63 comprises unit patterns composed of one and two halfdisc-shaped mask patterns, the unit patterns being disposed parallel to each other in a transverse direction. In FIG. 8, (C) is an enlarged view of the subpattern area 62, and (D) is an enlarged view of the subpattern area 63.

Changeable pattern areas 64 and 65 comprise rectangular-shaped areas which make unexposed portions on the photoresist film when projections of the mask patterns are effected. In FIG. 8, (A) and (B) are enlarged views of the changeable pattern areas 64 and 65 including some peripheral transfer patterns.

When the projections by using the exposing mask of FIG. 8 is effected, the transverse movement pitch length of the wafer is always constant, i.e., 5 mm, but the wafer is shifted, for example, by 10 $\mu$m in a longitudinal direction from a reference position every two projections.

In the above-mentioned embodiments, one selectively changes the relative distance of movement between the wafer and the exposing mask comprising the main pattern area including the changeable pattern area and the subpattern areas composed of groups of the unit patterns which are used for projecting selected transfer patterns on the changeable pattern area. This enables the use of a single exposing mask to continuously and easily form circuit patterns which are partially different from each other.

In the embodiments explained with reference to FIGS. 5 through 8, the connection of transfer patterns in the changeable pattern areas is effected at the portions of the gaps between the halfdisc-shaped patterns. Therefore, the bubble transfer characteristics may be affected if large errors in the movement pitch lengths and so on change the width of each of the gaps.

Figure 9A:
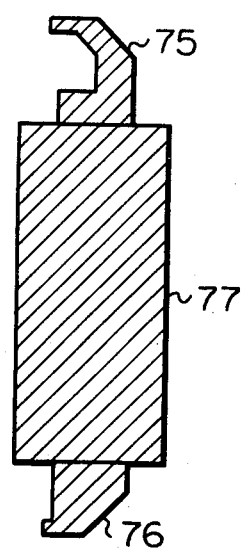
FIGS. 9A and 9B are schematic views illustrating mask patterns used in an embodiment according to the present invention.
Figure 9B:
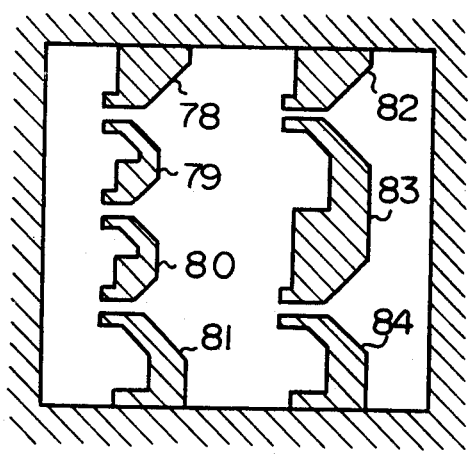
Figure 10A:
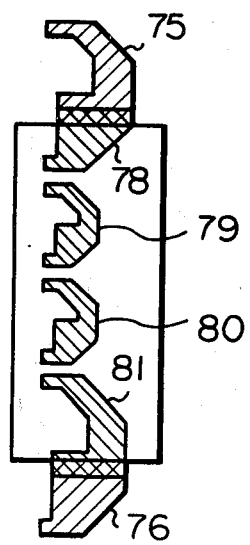
FIGS. 10A and 10B are schematic views illustrating transfer patterns formed by using the mask patterns of FIGS. 9A and 9B.
Figure 10B:
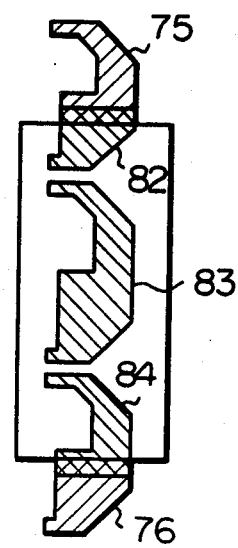

Another embodiment of the present invention by which such a possible defect can be avoided will now be explained with reference to FIGS. 9 through 11. FIGS. 9A and 9B illustrate essential portions of an exposing mask used in this embodiment. FIG. 9A illustrates a part of a main pattern area and FIG. 9B illustrates a subpattern area. In these drawings, 75 and 76 are transfer patterns formed in the main pattern area, 77 is a changeable area, and 78 through 84 are transfer patterns formed in the subpattern area. The transfer patterns 75 and 76 in the main pattern area (FIG. 9A) are partially cut by the changeable pattern area 77 within each of the halfdisc patterns 75 and 76. In the subpattern area (FIG. 9B), two unit patterns comprising a series of transfer patterns 78 through 81 and another series of transfer patterns 82 through 84 respectively are formed. The transfer pattern 83 is twice as large as each of the transfer patterns 79 and 80, and the number of bits of the transfer pattern 83 is smaller than that of the transfer patterns 79 and 80 by one. Each of the transfer patterns 78, 81 and 82, 84 disposed at the end portions of both unit patterns is partially cut by the subpatterns in within each of the halfdisc-shaped patterns. It should be noted that these transfer patterns 78, 81, 82, and 84 are cut in a manner that they partially overlap transfer patterns 75 and 76 of the main pattern area when the changeable pattern area 77 and the subpattern area are superposed on each other on the photoresist film.

A method of exposure by using the above-mentioned exposing mask will now be explained. A substrate coated with a photosensitive layer is mounted on a movable base of a projection-type exposing apparatus. The first projection is effected on the photosensitive layer by using the exposing mask, so that the main pattern area and the subpattern areas are projected on the photosensitive layer. The substrate is then moved by a predetermined pitch length and the second projection is effected, so that the subpattern area of FIG. 9B is projected on the changeable area 77 of the main pattern area projected at the first projection. In this case, location of the substrate at the position where the transfer patterns 75 and 76 of the main pattern area are connected to the transfer patterns 78 and 81 of the subpattern area would form the propagation patterns illustrated in FIG. 10A. Location of the substrate at the position where the transfer patterns 75 and 76 of the main pattern area are connected to the transfer patterns 82 and 84 of the subpattern area would form the propagation patterns illustrated in FIG. 10B, whose number of halfdisc-shaped patterns is one bit smaller than that of the propagation patterns of FIG. 10A. This enables the formation of circuit patterns similar to those of FIG. 5.

One of the advantages of the above-mentioned method of exposure is that the width of each of the gaps between the halfdisc-shaped patterns does not change so that bubble transfer characteristics are not affected, even if the erros in the movement pitch length and so on are not small. FIG. 11 illustrates manners of the connection of the transfer patterns in the cases that the position errors between the main pattern area and the subpattern area are zero or 0.5 μm in the X direction and/or Y direction. Actual experiments showed that the position errors of a magnitude from those of FIG. 11 to approximately ±1 μm do not affect the bubble transfer characteristics.

The above explained the method of exposure used for forming circuit patterns which are, for example, transfer patterns of a magnetic bubble memory device and which are composed of mutually independent circuit patterns. However, the present invention can be adapted not only to such cases but also to cases in which conducting patterns such as gate circuits or bubble detector circuits of the magnetic bubble memory device are mutually connected.

In a conventional bubble memory device, the mutual connection of the conducting patterns is effected by using bonding wires to connect the conducting patterns to a printed circuit pattern formed on a ceramic base on which the bubble memory chip is mounted. However, such an external connection is not preferable. Interconnection of the conducting patterns on the magnetic bubble memory chip when the conducting patterns are formed, would simplify the manufacturing process of the bubble memory device and significantly improve the reliability of the bubble memory device.

Figure 12:
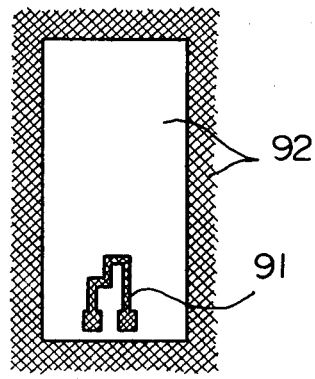
FIG. 12 is a schematic view illustrating a conductor pattern formed by using a conventional mask pattern.

FIG. 12 illustrates a conventional reticle, i.e., an exposing mask used for forming conducting patterns on a substrate by using a projection-type exposing apparatus whose reduction ratio is 1/10. The reticle of FIG. 12 has a rectangular-shaped transparent portion whose size is 100 mm by 50 mm and in which an opaque pattern is formed.

The opaque pattern 91 of FIG. 12 is an abbreviated expression of an enlarged pattern corresponding to a conductor circuit such as a gate circuit, a bubble generator, or a sense circuit, i.e., a bubble detector. These conductor circuits are formed on an insulating film of a substrate which comprises a magnetic thin layer of bubble crystalline material coated with the insulating film and which substrate corresponds to portions 92 of the reticle of FIG. 12. The conductor pattern of the conductor circuit 91 is formed by the following process. A conductor film of, for example, Au is formed on the entire surface of the insulating film of the substrate 92, and the conductor film is coated with a positive-acting photoresist film. The photoresist film is then exposed to light through the reticle of FIG. 12 comprising mask patterns 91. This exposure does not expose to light the portion of the photoresist film corresponding to the opaque portion 91, and polymerizes and makes dissolvable the exposed portion. A developing process is then used to form the resist patterns corresponding to the conducting circuits on the conducting film, and the succeeding etching process is used to form the conducting circuits corresponding to the mask patterns 91.

Figure 11:
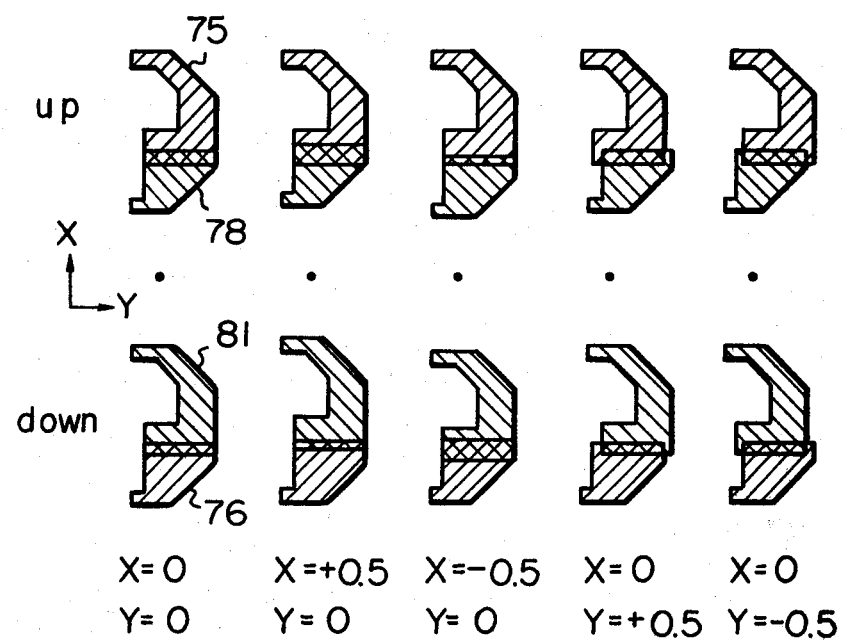
FIG. 11 is a schematic view illustrating connecting portions of the transfer patterns of FIGS. 10A and 10B.
Figure 13:
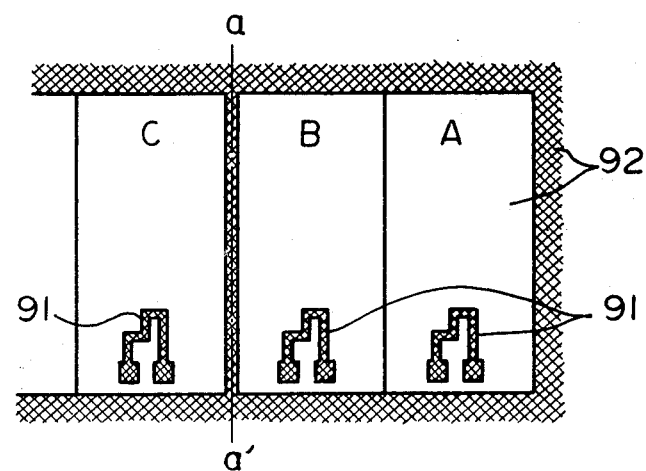
FIG. 13 is a schematic view illustrating conductor patterns of a magnetic bubble memory chip formed by sequential exposing of a conventional method.

FIG. 13 illustrates a conventional method of exposure which uses the reticle of FIG. 11. In FIG. 13, a pattern corresponding to the conductor pattern 91 is projected on the portion A of the resist film of the wafer substrate 92. After the wafer is moved by one pitch length, e.g., 5 mm, which corresponds to the width of a projected pattern by using the reticle, one projects a pattern which is the same as that projected on portion A on portion B, thereby finishing the projections for one bubble memory chip.

The third projection by the same reticle of FIG. 13 is effected on portion C, after the substrate 92 is moved by a distance slightly less than one pitch length, for example, 5.2 mm, thereby projecting the circuit pattern of a half of the next chip. In this way, the movement of the substrate 92 enables the photoresist film of the substrate 92 to be subjected to a plurality of projections thereby continuously forming patterns within one chip and forming a plurality of chip patterns with a predetermined gap between them. After these projections are effected, the above-mentioned developing process of the photoresist film and etching process of the conductor layer are effected, to form the conductor patterns 91 on the portions A, B, and C of the substrate, as illustrated in FIG. 13. A dotted line a . . . a' between the portions B and C of FIG. 13 shows a line along which the wafer is cut after the circuit chips on the wafer are completed.

Figure 14:
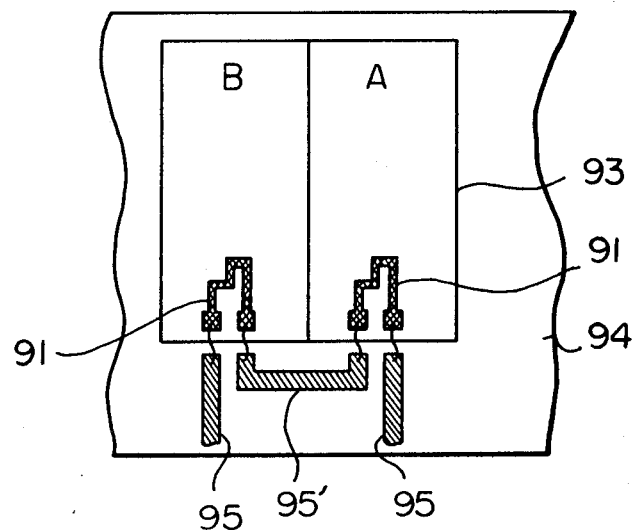
FIG. 14 is a schematic view illustrating pattern connections of conductor patterns of FIG. 13.

FIG. 14 illustrates a structure of a conventional bubble memory device. In the device of FIG. 14, wirebonding is used to connect the conductor patterns 91, 91 of the memory chip 93 and the printed conductor patterns 95 and 95' on a ceramic base 94 after mounting the memory chip 93 on the ceramic base 94.

As apparent from FIG. 14, conventional memory devices require the formation of the printed conductor pattern 95' on the substrate 94 and wirebonding to connect the conductor patterns 91 and the conductor patterns 95'. This complicates the manufacturing process of the memory device, thereby increasing the cost of the bubble memory device and making it difficult to obtain bubble memory devices having high reliability. Such defects arise from the fact that conventional bubble memory chips whose two groups of conducting patterns are formed by projecting the mask pattern twice, do not use a conducting pattern to interconnect the two groups of conducting patterns within the chips.

A method of exposure according to the present invention will now be explained with reference to FIGS. 15 through 17.

Figure 15:
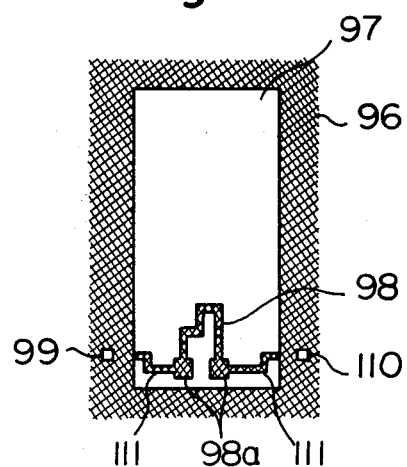
FIG. 15 is a schematic view illustrating a mask pattern used in a method according to the present invention.

FIG. 15 illustrates mask patterns of a reticle used in a method according to the present invention. The reticle of FIG. 15 is constituted by a mask board 96 which comprises transparent portions 97 and opaque portions 98 formed on a transparent board such as a glass board. The reticle of FIG. 15 comprises the rectangular-shaped transparent portions 97 of 100 mm by 50 mm which have the same size as that of the conventional reticle of FIG. 12. The reticle of FIG. 15 differs from that of FIG. 12 in that the opaque patterns 98 formed in the transparent portion 97 have square transparent portions 99 and 110 of small size which are formed on both sides of the transparent portion 97 and which are used for connecting or disconnecting the conductor patterns in a bubble memory chip. The opaque pattern 98 has a portion which is substantially the same as the conventional conductor pattern 91, and stepped connecting pattern portions 111 which extend outwardly from terminal portions 98a. The end portions of the stepped connecting pattern portions 111 face transparent portions 99 and 110 through a predetermined distance therebetween which are formed outside the transparent portion 97. Therefore, the reticle of FIG. 15 has transparent portions 97, 99, and 110 through which the photoresist film on the substrate is exposed to light when the projection by using the reticle is effected.

Figure 16:
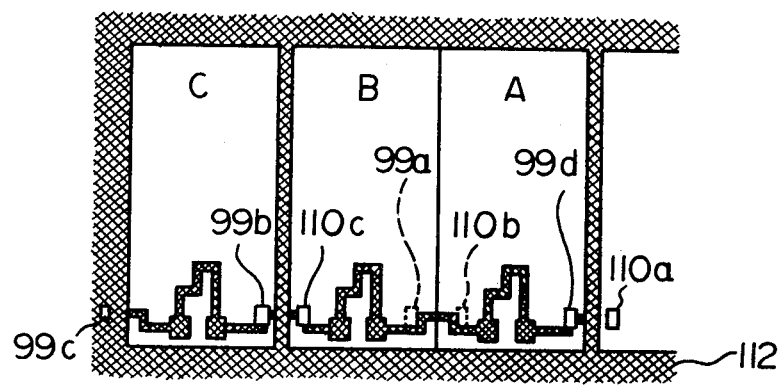
FIG. 16 is a schematic view illustrating conductor patterns of a magnetic bubble memory chip formed by a method according to the present invention.

FIG. 16 illustrates a method of exposure for making the resist patterns of a bubble memory chip according to the present invention. In FIG. 16, a substrate 112 which is exposed comprises a magnetic thin layer of bubble crystalline material coated with an insulating film. On the insulating film is formed a conductor film of, for example, Au which is coated with a positive-acting photoresist film. In the method of exposure according to the present invention, the first projection by using the reticle of FIG. 15 is effected on a portion A of the photoresist film of the substrate 112. The second projection is effected on a portion B after the substrate 112 is transferred by a distance of 4.95 mm, slightly less than the pitch length. By overlapping the exposed areas of the first and the second projections, it is possible to avoid leaving a resist pattern between the portion A and the portion B, which would cause conductor shortage.

The first projection effected on the portion A also exposes to light a portion 99a of the photoresist film which exists within the portion B and which corresponds to the transparent portion 99 of the reticle of FIG. 15, and also exposes to light a portion 110a of the photoresist film corresponding to the transparent portion 110 of the same reticle.

The second projection effected on the portion B re-exposes to light, a portion 110b of the photoresist film, which is shown by a dotted line and which exists within the already exposed portion A, through the transparent portion 110. Another portion 99b of the photoresist film on which the connecting pattern 111 of the opaque pattern 98 will be projected by the third projection and which exists within the portion C is previously exposed to light by the transparent portion 99.

The third projection on the portion C is effected after the substrate 112 is moved by a distance of 5.15 mm, slightly more than the pitch length. The third projection also exposes to light the portion 110c, which exists on the connecting pattern 111 within the portion B and which was not exposed to light previously, through the transparent portion 110 of the reticle and exposes to light the portion 99c, on the photoresist film outside the portion C, through the transparent portion 99.

The unexposed resist patterns, i.e., meshed portions of FIG. 16 corresponding to the opaque patterns 98 and the connecting patterns 111 projected on the photoresist film, of portions A and B are connected to each other because said portions are projected so that both facing edge portions of said portions overlap. In this case, the portions of the portions 99a and 110b projected through the transparent portions 99 and 110 do not coincide with the positions of the unexposed resist patterns, i.e., the connecting pattern portions, and, therefore, the connecting pattern portions are not exposed to light.

Since portions B and C are projected at a distance slightly more than the pitch length, the projection effected on the portion B exposes to light the connecting pattern 111 of portion C, which will be projected after portion B, at a position 99b. The projection effected on portion C exposes to light the unexposed connecting pattern within the portion B at a position 110c, to cut the connecting resist pattern at the position 110c. The connecting pattern within portion A is cut at a position 99d which is exposed to light by the former projection through the transparent portion 99 of the reticle in a similar manner to the position 99b within portion C.

The photoresist film on the substrate 112 which is exposed in the above-mentioned manner by using the reticle of FIG. 15 is developed, and the unexposed resist patterns are formed on the conducting film of the substrate 112 as illustrated in FIG. 16. The conducting film is then etched, so that the conductor patterns corresponding to the resist patterns are formed on the substrate 112 through the insulating film formed therebetween.

Figure 17:
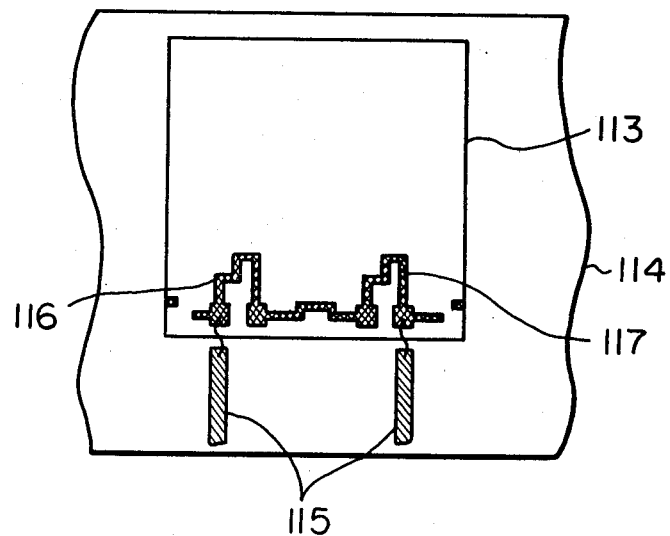
FIG. 17 is a schematic view illustrating pattern connections of conductor patterns of FIG. 16.

FIG. 17 illustrates a bubble memory device in which conductor pattern 116 and 117 of a bubble memory chip 113 formed by the above-mentioned method of exposure according to the present invention and mounted on a ceramic base 114 are connected to printed conductor patterns 115 on the ceramic base by wirebonding. It should be noted that, in the bubble memory device of FIG. 17, the conductor patterns 116 and 117 are interconnected within the chip 113, and it is not necessary to connect these conductor patterns 116 and 117 by wirebonding.

Figure 18:
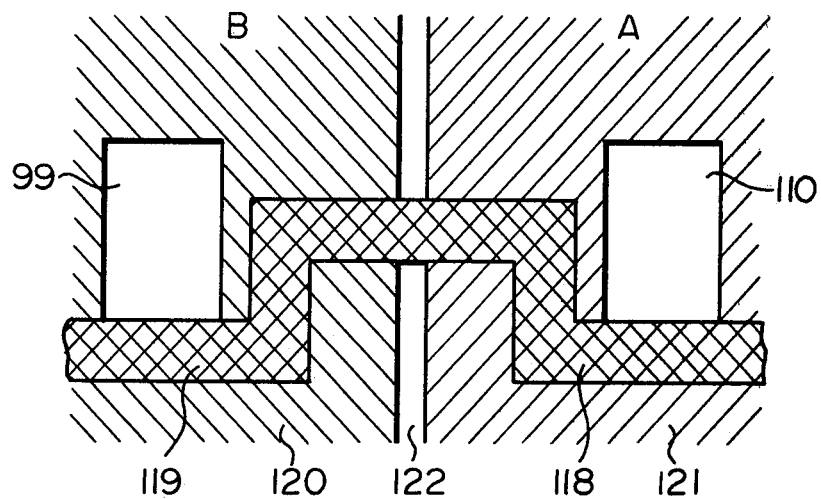
FIGS. 18 and 19 are enlarged views illustrating parts of conductor patterns of FIG. 16.
Figure 19:
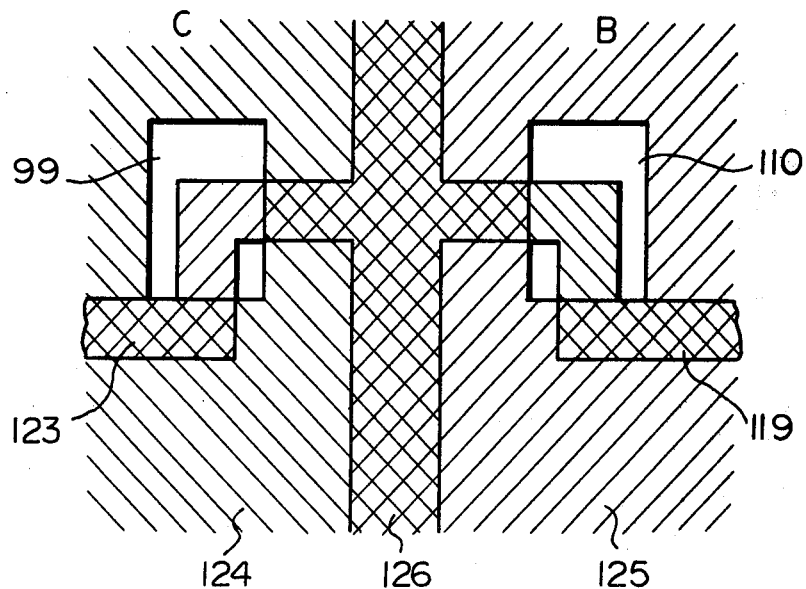

FIGS. 18 and 19 are enlarged views illustrating portions of the resist patterns of the portions A, B, and C of FIG. 16 in which the resist portions are connected or disconnected according to the distances of movement of the wafer substrate. FIG. 18 illustrates a manner in which resist patterns 118 and 119 of the portions A and B are interconnected. In FIG. 18, a portion 120 hatched by oblique lines extending from the upper left to lower right shows an area which is not exposed to light when the portion A is projected, and a portion 121 hatched by oblique lines extending from the upper right to lower left shows an area which is not exposed to light when the portion B is projected. Therefore, only resist patterns 118 and 119 shown by meshed lines remain unexposed after both the portions A and B are projected, and positions of the exposed portions through the transparent portions 99 and 110 of the reticle do not coincide with the portions of these resist patterns 118 and 119. In this case, the overlapped portion 122 of portions A and B are twice exposed to light.

FIG. 19 illustrates a manner in which resist patterns 119 and 123 of portions B and C are disconnected. In FIG. 19, a portion 124 hatched by oblique lines extending from the upper left to lower right shows an area which is not exposed to light when portion B is projected, and a portion 125 hatched by oblique lines extending from the upper right to lower left shows an area which is not exposed to light when portion C is projected. The portions shown by meshed lines are not exposed to light even after both portions B and C are projected, and resist patterns 119 and 123 are both cut by the exposed area corresponding to the transparent portions 99 and 110 of the reticle. A boundary portion 126 between portions B and C remains unexposed. However, since the wafer is cut along the boundary portion 126, the characteristics of the bubble memory chip are not affected by the remainder of the unexposed boundary portion 126.

It is possible to interconnect the conductor patterns within the chip, even if the above-mentioned disconnection of the conductor patterns is not effected, that is, even if the reticle of FIG. 15 does not have the transparent areas 99 and 110. However, it should be noted that if the above-mentioned disconnection is not effected, the conductor patterns of the portions B and C are short-circuited and, therefore, it becomes impossible to test each memory chip before cutting the wafer into the bubble memory chips.

In a conventional manufacturing process, conductor patterns of a memory chip having a large memory capacity are formed by projecting mask patterns two times side by side using the same reticle, and the interconnection between the conductor patterns is effected by wirebonding. However, according to the present invention, the connection or disconnection between the conductor patterns is effected within a chip by projecting partially modified mask patterns of a single reticle while changing the distance of movement of the wafer slightly from the pitch length.

According to the present invention, it is also possible to form bubble propagation lines, i.e., transfer patterns which connect between a plurality of bubble areas which are surrounded by guardrails and which are formed by a plurality of projections.

Figure 20A:
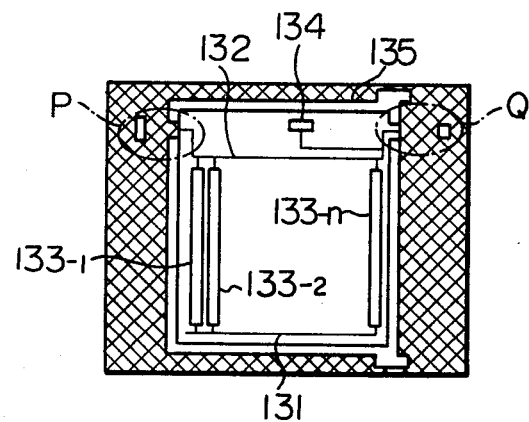
FIGS. 20A through 20C are schematic views illustrating mask patterns used in a method according to the present invention.
Figure 20B:
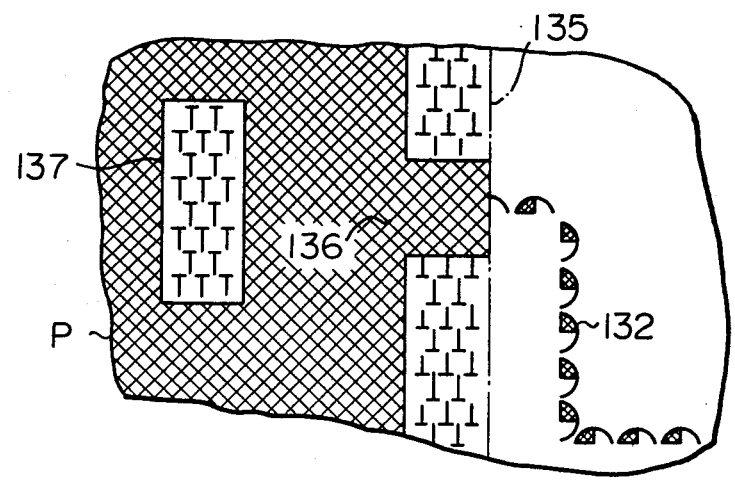
Figure 20C:
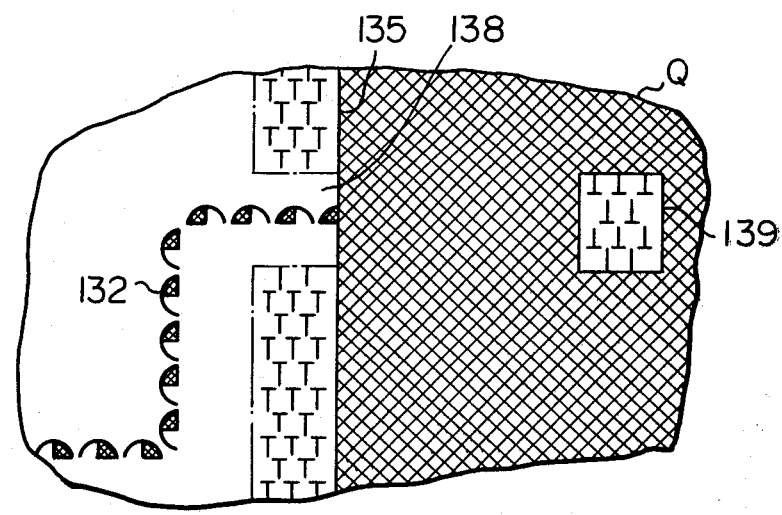

FIGS. 20A through 20C illustrate a reticle used for effecting such pattern formation. FIG. 20A is a total view of the reticle and FIGS. 20B and 20C are enlarged views illustrating a portion P of FIG. 20A and a portion Q of FIG. 20A, respectively. In these drawings, 131 is a write-in major line, 132 is a readout major line, 133-1 through 133-n are minor loops connected between the write-in major line 131 and the readout major line 132, 134 is a bubble detector connected to the readout major line 132, and 135 designates guardrails composed of arrays of T-shaped patterns.

As also illustrated in FIG. 20B, a part of the guardrails 135 is missing at the portion P of FIG. 20A and the readout major line 132 extends to a line corresponding to an inner edge portion of the guardrails 135 at a missing portion 136 of the guardrails. At an outside portion of the missing portion 136 are formed short guardrail patterns 137 whose length is slightly greater than the width of the missing portion 136. As also illustrated in FIG. 20C, another part of the guardrails 135 is missing at the portion Q of FIG. 20A and the readout major line 132 extends to a line corresponding to an outer edge of the guardrails 135 at a missing portion 138 of the guardrails. At an outside portion of the missing portion 138 are formed short guardrail patterns 139 which have the same length as the width of the lacked portion 138.

Figure 21A:
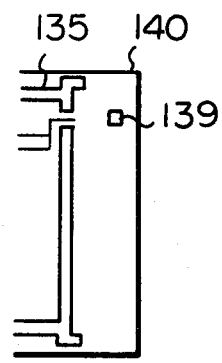
FIGS. 21A through 21D are schematic views illustrating a process of forming transfer patterns of a magnetic bubble memory device by using a method according to the present invention.
Figure 21B:
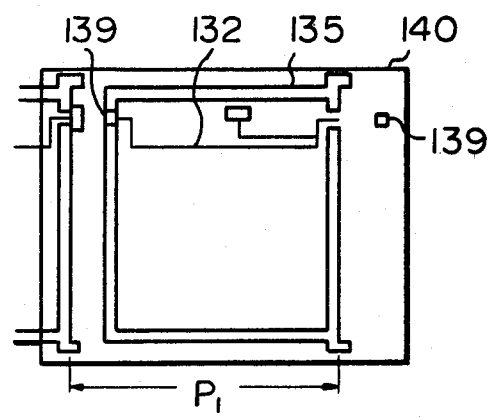
Figure 21C:
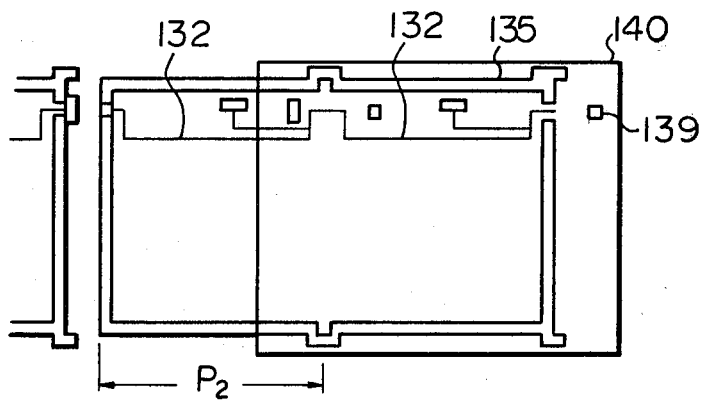
Figure 21D:
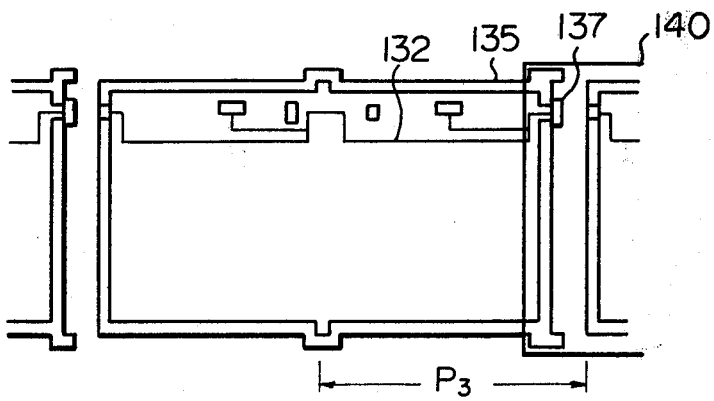

A process of forming bubble memory elements by using the above-mentioned reticle will now be explained with reference to FIGS. 21A through 21D. First of all, the right portion of the reticle 140 is projected on a photosensitive layer formed on a wafer. The wafer is then moved by a distance P1 and the second projection of the reticle on the photosensitive layer is effected. The distance P1 is determined so that the short guardrail patterns 139 projected by the first projection fits into the missing portion 136 of the left guardrail portions, as illustrated in FIG. 21B.

The wafer is then transferred by a distance P2 and the third projection of the reticle is effected. The distance P2 is determined so that the left guardrail portions coincide with the right guardrail portions which are previously projected. The double exposure therefore erases the overlapped guardrail portions between the bubble areas projected by the second and the third projections, and the readout major lines 132 of both the bubble areas extending from the left side and the right side are interconnected. It should be noted that it is possible to form a larger memory element composed of a plurality of mutually interconnected unit patterns if a plurality of continuous exposures is effected at the same pitch length P2.

The wafer is then moved by a distance P3 and the fourth projection of the reticle 140 is effected. The distance P3 is determined so that the short guardrail portions 137 contact the outer edge of the previously projected guardrails 135 and close the missing portion 138 thereof.

In this way, it is possible to interconnect the readout major lines in the magnetic bubble memory device whose memory pattern is formed by projecting a plurality of unit patterns. It is apparently possible to interconnect write-in major lines by using a similar method. Therefore, in the above-mentioned embodiment, it is possible to form a memory element having a chip area larger than a limited projectable area of an exposing apparatus quite easily by using a single reticle.

I claim:

1. A method of projecting circuit patterns which uses a photosensitive layer formed on a substrate and an exposing mask which has mask patterns formed within a transparent area thereof, said exposing mask and said substrate being relatively moved by predetermined pitch lengths while said mask patterns are printed on said photosensitive layer at every relative position, said printed mask patterns formed on said photosensitive layer a plurality of element patterns each of which comprises at least two adjacent circuit patterns, said method characterized in that said exposing mask comprises a first transparent area and second transparent areas which are disposed to the two sides of said first transparent area along the direction of movement of said substrate; said pitch length comprises pitch length A between adjacent printed mask patterns within said element pattern and pitch length B between adjacent printed mask patterns of the adjacent element patterns, said pitch length A and said pitch length B, being kept at constant values and said pitch length B being greater than said pitch length A; and mask patterns of said second transparent areas are printed on portions of areas of said photosensitive layer which correspond to said first transparent areas printed one pitch length before and after the projection of said mask patterns of said second transparent area, thereby forming said element pattern including different portions from said mask patterns of said exposing mask.

2. A method of claim 1, wherein said mask patterns of each of said second transparent areas comprise at least two unit patterns, and one of said two unit patterns is selectively projected on the portion of said photosensitive layer corresponding to a predetermined area within said first transparent area according to a distance of relative movement between said substrate and said exposing mask.

3. A method of claim 2, wherein said predetermined area within said first transparent area is an area including a part of a bubble propagation line of a magnetic bubble memory chip.

4. A method of claim 3, wherein said predetermined area of said first transparent area includes a missing portion of transfer patterns of a bubble propagation line, and said second transparent area includes a plurality of transfer pattern arrays, the number of transfer patterns of each of said transfer pattern arrays being different from each other by one bit.

5. A method of claim 4, wherein one of said plurality of transfer pattern arrays of each of said second transparent areas is selectively projected within said missing portion of the transfer patterns according to the distance of relative movement between said substrate and said exposing mask.

6. A method of claim 5, wherein said missing portion of the transfer patterns includes partially missing transfer patterns, and each of said transfer pattern arrays within said second transparent area includes partial transfer patterns, interconnection between the transfer patterns of said first transparent area and the transfer pattern arrays within said second transparent area being effected within the transfer patterns.

7. A method of claim 4, 5, or 6, wherein said transfer patterns are halfdisc-shaped patterns.

8. A method of claim 1, wherein portions corresponding to a conductor pattern within said first transparent area are exposed or unexposed through said second transparent areas according to relative transfer distances between said substrate and said exposing mask, thereby said conductor patterns are interconnected or disconnected to each other.

9. A method of claim 1, wherein said exposing mask comprises mask patterns corresponding to a magnetic bubble storing area, guardrails which surround said magnetic bubble storing area and which have missing portions, write-in and/or readout bubble propagation lines which extend to inlets or outlets, and closing guardrail portions which are formed outside of said lacking portions of said guardrails short distances apart from said guardrails, said bubble propagation lines of a plurality of said magnetic bubble storing area formed by a plurality of projections being mutually connected or disconnected and said missing portions being closed by said closing guardrail portions, according to distances of relative movement between said exposing mask and said substrate.

10. A method of claim 9, wherein said write-in and/or readout bubble propagation lines comprise halfdisc-shaped pattern arrays.

* * * * *

UNITED STATES PATENT AND TRADEMARK OFFICE
CERTIFICATE OF CORRECTION

PATENT NO. : 4,408,875

DATED : October 11, 1983

INVENTOR(S) : Teiji Majima

Page 1 of 2

It is certified that error appears in the above-identified patent and that said Letters Patent is hereby corrected as shown below:

On the title page

Front page, [22] Filed, "Dec. 31" should be --Dec. 23--.

Col. 3, line 19, "area" should be --areas--;

line 33, "area" should be --areas--.

Col. 5, line 52, "halfdisc-shaped" should be --half-disc shaped--.

Col. 7, line 26, after "ing" insert --to--;

line 33, "halfdisc-shaped" should be --half-disc shaped--;

line 44, "halfdisc-type" should be --half-disc shaped -- line 51, "halfdisc should be --half-disc shaped --

Col. 10, line 45, "halfdisc-shaped" should be --half-disc shaped--.

Col. 11, line 7, "halfdisc-shaped" should be --half-disc shaped--;

line 23, "halfdisc" should be --half-disc--;

line 33, "halfdisc-shaped" should be --half-disc shaped--;

line 60, "halfdisc-shaped" should be --half-disc shaped--;

UNITED STATES PATENT AND TRADEMARK OFFICE
CERTIFICATE OF CORRECTION

PATENT NO. : 4,408,875   Page 2 of 2
DATED : October 11, 1983
INVENTOR(S) : Teiji Majima It is certified that error appears in the above-identified patent and that said Letters Patent is hereby corrected as shown below:

line 65, "halfdisc-shaped" should be --half-disc shaped--.

Col. 14, line 47, "portions" (first occurrence) should be --positions--.

Col. 15, line 7, "pattern" should be --patterns--;

line 19, "portions" should be --patterns--.

Col. 17, line 20, "formed" should be --forming--;

line 39, "area" should be --areas--.

Col. 18, line 25, "halfdisc-shaped" should be --half-disc shaped--;

line 31, "thereby" should be --whereby--;

line 49, "halfdisc" should be --half-disc--.

Signed and Sealed this

Twenty-eighth Day of August 1984

[SEAL]

Attest:

GERALD J. MOSSINGHOFF

Attesting Officer    Commissioner of Patents and Trademarks